US008933454B2

(12) United States Patent
Kim et al.

(10) Patent No.: US 8,933,454 B2
(45) Date of Patent: Jan. 13, 2015

(54) ARRAY SUBSTRATE FOR LIQUID CRYSTAL DISPLAY AND METHOD FOR MANUFACTURING THE SAME

(71) Applicant: LG Display Co., Ltd., Seoul (KR)

(72) Inventors: Jinpil Kim, Paju-si (KR); Kiyoung Jung, Paju-si (KR); Keumkyu Min, Paju-si (KR); Sangsu Jang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/891,557

(22) Filed: May 10, 2013

(65) Prior Publication Data

US 2013/0313556 A1 Nov. 28, 2013

(30) Foreign Application Priority Data

May 24, 2012 (KR) .................. 10-2012-0055445

(51) Int. Cl.
*H01L 29/04* (2006.01)
*H01L 27/12* (2006.01)
*G02F 1/1362* (2006.01)
*G02F 1/1337* (2006.01)
*G02F 1/1343* (2006.01)

(52) U.S. Cl.
CPC ........ *H01L 27/124* (2013.01); *G02F 1/136227* (2013.01); *H01L 27/1288* (2013.01); *H01L 27/1248* (2013.01); *G02F 1/133711* (2013.01); *G02F 2001/134372* (2013.01)
USPC .............................................. 257/59; 257/72

(58) Field of Classification Search
USPC ....................... 257/59, 72, 257, 290
See application file for complete search history.

(56) References Cited

U.S. PATENT DOCUMENTS

| 7,646,023 | B2 * | 1/2010 | Park et al. ................... 257/72 |
| 8,531,637 | B2 * | 9/2013 | Ishiguro et al. ............. 349/138 |
| 2007/0279564 | A1 | 12/2007 | Iwato et al. |
| 2010/0079713 | A1 | 4/2010 | Asuma et al. |
| 2012/0057110 | A1 | 3/2012 | Ishiguro et al. |

FOREIGN PATENT DOCUMENTS

JP  2007041184 A  2/2007

OTHER PUBLICATIONS

Extended European Search Report issued in corresponding European Patent Application No. 13168490.4, mailed Sep. 27, 2013, 7 pages.

* cited by examiner

*Primary Examiner* — Quoc Hoang
(74) *Attorney, Agent, or Firm* — Brinks Gilson & Lione

(57) ABSTRACT

An array substrate for a liquid crystal display and a method for manufacturing the same are disclosed. The array substrate for a liquid crystal display includes a source electrode and a drain electrode and an organic insulating film positioned on the source electrode and the drain electrode. The organic insulating layer includes a first contact hole exposing the drain electrode, and having a stepped level difference formed on the sloping surface of the first contact hole.

8 Claims, 8 Drawing Sheets

ARRAY SUBSTRATE FOR LIQUID CRYSTAL DISPLAY AND METHOD FOR MANUFACTURING THE SAME

This application claims the benefit of priority of Korean Patent Application No. 10-2012-0055445 filed on May 24, 2012, the entire contents of which are incorporated herein by reference for all purposes as if fully set forth herein.

FIELD OF THE INVENTION

This disclosure relates to an array substrate for a liquid crystal display and a method for manufacturing the same. This disclosure also relates to an array substrate for a liquid crystal display which prevents defective application of an alignment film and improves display quality by forming a level difference in a contact hole, and a method for manufacturing the same.

DISCUSSION OF THE RELATED ART

In general, a liquid crystal display utilizes optical anisotropy and polarization properties of a liquid crystal. Liquid crystals have a thin, long structure, and have an orientation in the alignment of their molecules. The direction of the alignment of liquid crystal molecules can be controlled by applying an electric field to the liquid crystal. Thus, when the direction of the alignment of molecules of the liquid crystal is adjusted, the alignment of molecules of the liquid crystal can be changed, and light is refracted in the direction of the molecular alignment of the liquid crystal by optical anisotropy, thus displaying image information.

Currently, an active matrix liquid crystal display (AM-LCD) (which will be referred to as an 'LCD', hereinafter) in which a thin film transistor and a pixel electrode connected to the thin film transistor are arranged in a matrix form has come to prominence because of its excellent resolution and video implementation capabilities. The LCD includes a color filter substrate on which a common electrode is formed, an array substrate on which pixel electrodes are formed, and liquid crystal filled between the upper substrate and the lower substrate. In this type of LCD, the common electrode and the pixel electrodes drive the liquid crystals by a vertically applied electric field, thus offering excellent transmittance, aperture ratio, and the like.

However, the driving of liquid crystal by the vertically applied electric field is disadvantageous in that viewing angle characteristics are not good. Thus, in order to overcome this disadvantage, an in-plane field type liquid crystal display having excellent viewing angle characteristics has been proposed. In the in-plane field type liquid crystal display, a thin film transistor is formed on a substrate, the thin film transistor is insulated by an organic insulating film, and then a passivation film is formed between a common electrode and a pixel electrode to apply vertical and horizontal electric fields between the common electrode and the pixel electrode. However, the depth of a contact hole that connects the thin film transistor and the pixel electrode is quite large, and hence the alignment film may not be spread into the contact hole.

FIG. 1 is a cross-sectional view of a conventional array substrate for a liquid crystal display. FIG. 2a is a picture of the conventional array substrate for a liquid crystal display, and FIG. 2b is a picture of a conventional liquid crystal display.

Referring to FIG. 1, an organic insulating film 10 is positioned on a drain electrode 5 of a thin film transistor. The organic insulating film 10 has a contact hole exposing the drain electrode 5. A passivation film 15 is positioned on the organic insulating film 10, and a pixel electrode 20 is connected to the drain electrode 5 via the contact hole.

An inkjet device having a plurality of nozzles may be used to form the alignment layer 30. However, because an interval between the nozzles of the inkjet device is wide, an ink emitted from the nozzle is not widely spread on the alignment layer 30 and thus is not filled in a contact hole. Accordingly, an alignment film 30 to be formed on the entire surface of the substrate is not spread into the contact hole, but stays around the contact hole. Therefore, as shown in FIG. 2a, a dark fringe is generated around the contact hole when the alignment film has not been spread into the contact hole. Also, as shown in FIG. 2b, display quality of the LCD deteriorates, such as through smudges appearing over the area where application of the alignment film 30 does not cover the entire surface of the liquid crystal display.

SUMMARY OF THE INVENTION

Embodiments of the present invention have been made in an effort to provide an array substrate for a liquid crystal display, which improves transmittance by reducing the surface area of a contact hole, and may solve problems concerning the non-spreading of an alignment film, and a method for manufacturing the same.

In one aspect, there is an array substrate for a liquid crystal display, comprising a substrate, a gate line and a common line positioned on the substrate, a gate insulating film positioned on the gate line and the common line, a semiconductor layer positioned on the gate insulating film, and facing the gate line, a source electrode and a drain electrode positioned on the semiconductor layer, an organic insulating film positioned on the source electrode and the drain electrode, comprising a first contact hole exposing the drain electrode, and having a stepped level difference formed on the sloping surface of the first contact hole, a common electrode positioned on the organic insulating film, and connected to the common line, a passivation film positioned on the substrate having the common electrode, and contacting the drain electrode via the first contact hole, and a pixel electrode positioned on the passivation film to correspond to the common electrode, and contacting the drain electrode.

In another aspect, there is a method for manufacturing an array substrate for a liquid crystal display, the method comprising forming a substrate, forming a gate line and a common line on the substrate, forming a gate insulating film on the gate line and the common line, forming a semiconductor layer facing the gate line on the gate insulating film, forming a source electrode and a drain electrode on the semiconductor layer, forming an organic insulating film on the source electrode and the drain electrode to expose the source electrode and the drain electrode, forming a first contact hole exposing the drain electrode, and forming a level difference on the sloping surface of the first contact hole, forming a common electrode on the organic insulating film to be connected to the common line, forming a passivation film on the substrate having the common electrode so as to contact the drain electrode via the first contact hole, and forming a pixel electrode on the passivation film to correspond to the common electrode and to contact the drain electrode.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIG. 8b is a picture showing the contact holes of FIG. 8a.

DETAILED DESCRIPTION OF THE EMBODIMENTS

Reference will now be made in detail to embodiments of the invention, examples of which are illustrated in the accompanying drawings. Wherever possible, the same reference numbers will be used throughout the drawings to refer to the same or like parts.

Figure 1:
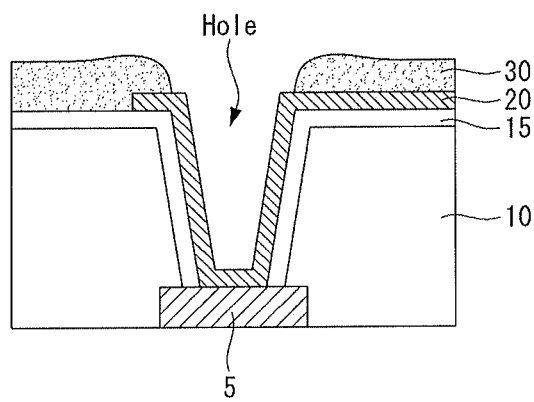
FIG. 1 is a cross-sectional view of a conventional array substrate for a liquid crystal display.
Figure 2A:
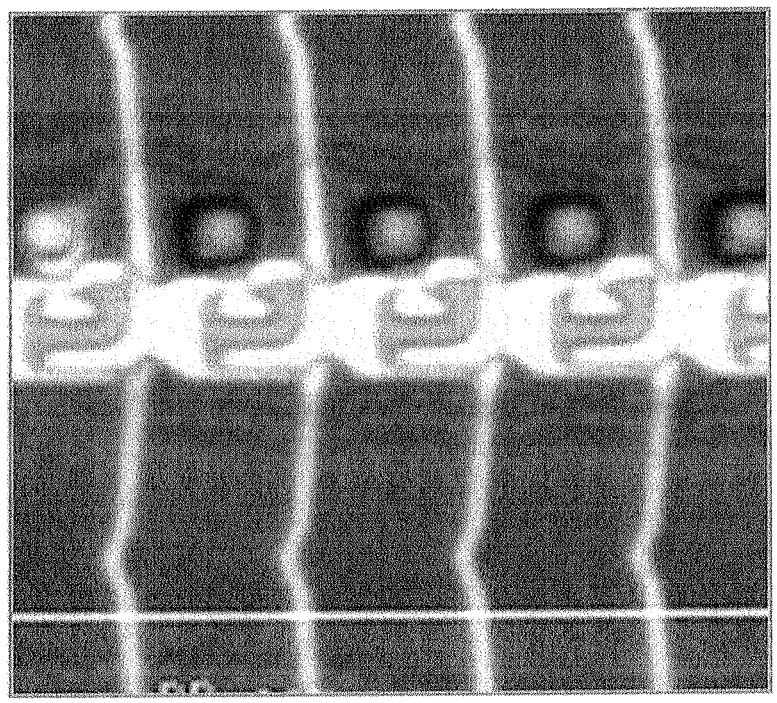
FIG. 2a is a picture of the conventional array substrate for a liquid crystal display.
Figure 2B:
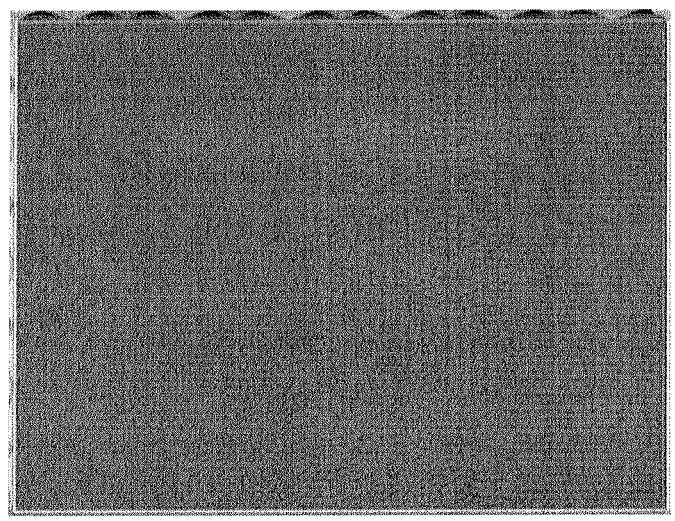
FIG. 2b is a picture of a conventional liquid crystal display.
Figure 3:
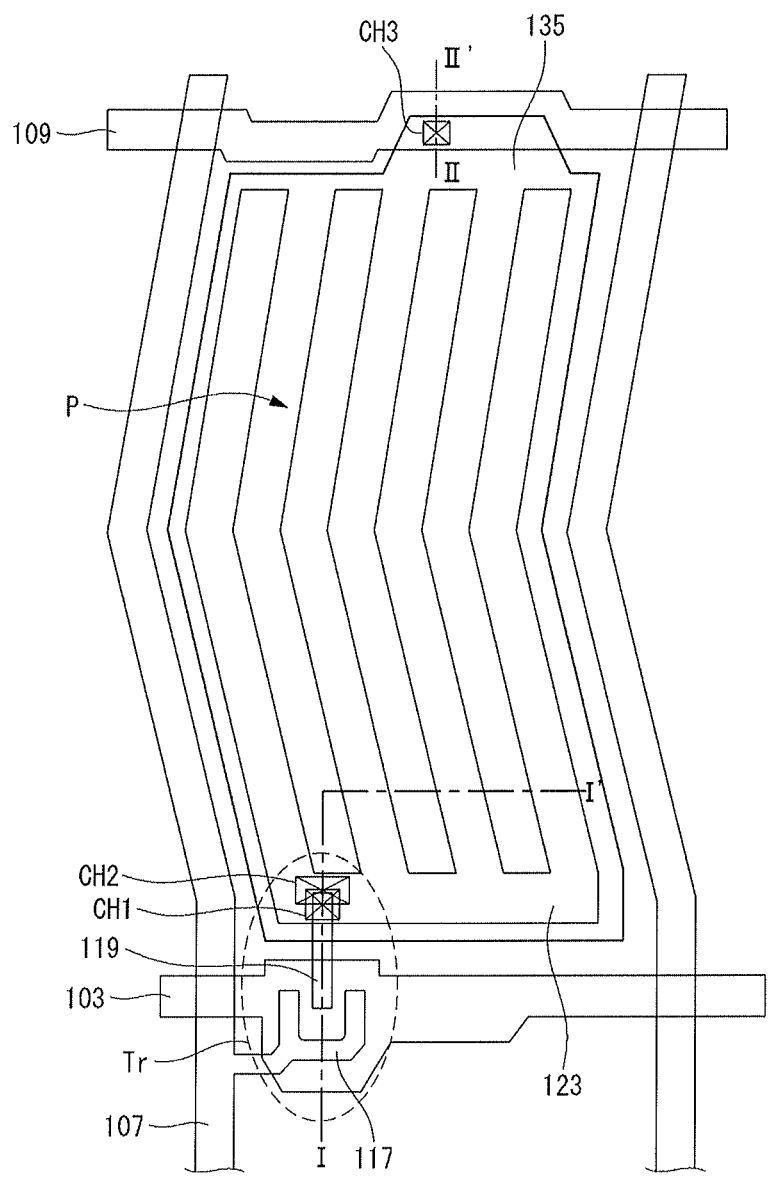
FIG. 3 is a top plan view showing an array substrate for a liquid crystal display in accordance with an exemplary embodiment of the present invention.

FIG. 3 is a top plan view showing an array substrate for a liquid crystal display in accordance with an exemplary embodiment of the present invention.

Referring to FIG. 3, a gate line 103 is positioned on a substrate (not shown) comprising a plurality of subpixels P so as to extend in one direction, and a data line 107 that crosses the gate line 103. A common line 109 is arranged parallel to the gate line 103, and crosses the data line 107. The subpixel P shown in FIG. 3 is defined by the crossings of the gate line 103, the data line 107, and the common line 109.

A thin film transistor Tr is positioned in a subpixel P, and comprises a gate electrode (not shown) connected to the gate line 103, a gate insulating film (not shown), a semiconductor layer (not shown), a source electrode 117 electrically connected to the data line 107, and a drain electrode 119 spaced apart from the source electrode 117.

Although these drawings illustrate the thin film transistor as having a channel forming area with a U-shape, the present invention is not limited thereto and the channel forming area may have an I-shape, as one example. Also, although these drawings illustrate the thin film transistor TR such that the gate line 103 is used as a gate electrode, the present invention is not limited thereto. For example, a portion protruding from the gate line 103 toward a subpixel P may be used as the gate electrode.

In a subpixel P shown in FIG. 3, a finger-shaped pixel electrode 135 is connected to the drain electrode 119 of the thin film transistor Tr via a first contact hole CH1. A common electrode 123 is positioned corresponding to the pixel electrode 135 formed on the subpixel P. The common electrode 123 may have a rectangular plate shape, for example.

The common electrode 123 is electrically connected to the common line 109 via a third contact hole CH3 so as to be applied with a voltage. In embodiments of the present invention, a level difference may be formed in the first contact hole CH1 of an organic insulating film (not shown) between the thin film transistor Tr and the pixel electrode 135, or on other portions of the organic insulating film or other layers. One example of a level difference is a stepped level difference that includes one or more steps along a sloping surface of the organic insulating film. Additionally or alternatively, a level difference may include multiple changing or different slopes along the organic insulating film, in order to ease and/or support application of an alignment film over the first contact hole CH1 or other contact holes.

Now, a cross-sectional structure based on the planar structure of the above-described array substrate for a liquid crystal display will be described.

Figure 4:
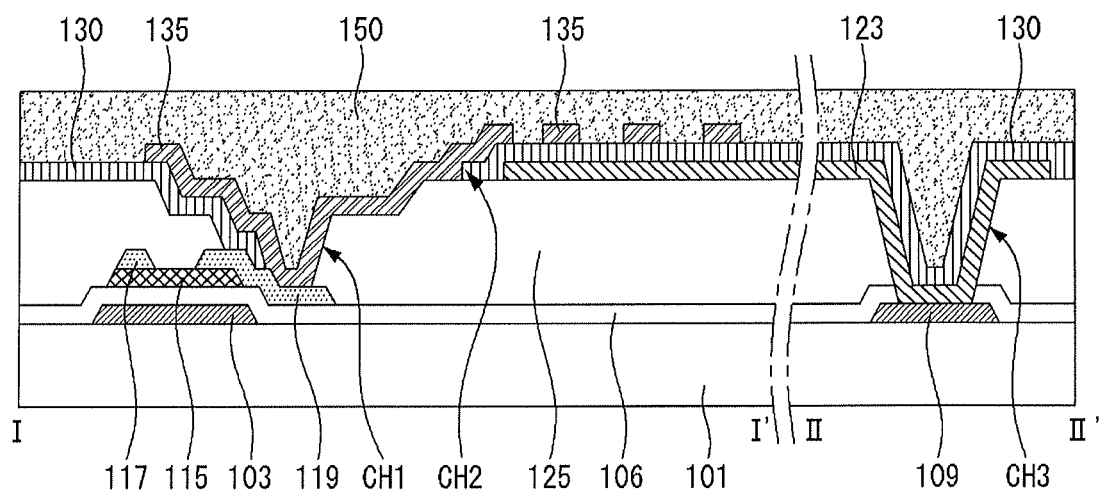
FIG. 4 is a cross-sectional view taken along the lines I-I' and II-II' of FIG. 3.

FIG. 4 is a cross-sectional view taken along the lines I-I' and II-II' of FIG. 3. Referring to FIG. 4, an array substrate for a liquid crystal display in accordance with an exemplary embodiment of the present invention comprises a gate electrode 103 positioned on a substrate 101, the gate electrode 103 is integrated with a gate line (not shown) arranged in one direction. A common line 109 is positioned on the same plane as the gate electrode 103.

A gate insulating film 106 is positioned on and insulates the gate electrode 103 and the common line 109. A semiconductor layer 115 is positioned on the gate insulating film 106, corresponding to the gate electrode 103. A source electrode 117 and a drain electrode 119 are respectively positioned on opposite ends of the semiconductor layer 115. Accordingly, a thin film transistor Tr is formed to comprise the gate electrode 103, the semiconductor layer 115, the source electrode 117, and the drain electrode 119.

An organic insulating film 125 for protecting and insulating the elements thereunder is positioned on the substrate 101 where the source electrode 117 and the drain electrode 119 are formed. The organic insulating film 125 has a large relative thickness in the array substrate, and is formed to include a first contact hole CH1 exposing the drain electrode 119. The first contact hole CH1 allows and/or causes a pixel electrode 135 and the drain electrode 119 to come in contact with each other.

A third contact hole CH3 exposing the common line 109 is formed in the organic insulating film 125 and the gate insulating film 106. A rectangular plate-shaped common electrode 123 is positioned on the organic insulating film 125. The common electrode 123 contacts the common line 109 via the third contact hole CH3.

A passivation film 130 is positioned on the substrate 101 where the common electrode 123 is formed. The passivation film 130 insulates the common electrode 123, and has a second contact hole CH2 exposing part of the drain electrode 119. The second contact hole CH2 formed in the passivation film 130 may partially overlap the first contact hole CH1 formed in the organic insulating film 125. The a part of the drain electrode 119 exposed by the first contact hole CH1 and a part of the passivation film 130 are brought into contact with each other. As such, a level difference is formed on the organic insulating film 125 and the passivation film 130.

A pixel electrode 135 is positioned on the passivation film 130 to contact the drain electrode 119 via the first and second contact holes CH1 and CH2. The pixel electrode 135 may have a finger shape, and is formed to correspond to the common electrode 123. Thus, both vertical and horizontal electric fields may be formed between the pixel electrode 135 and the common electrode 123 upon driving.

Figure 5:
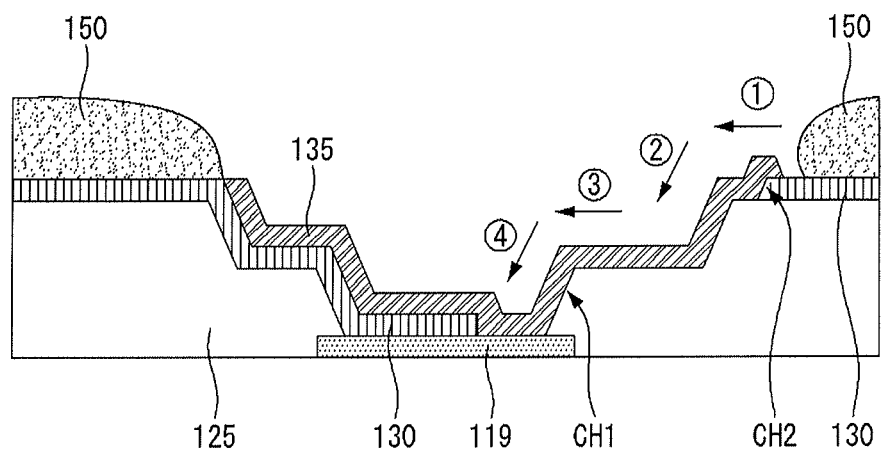
FIG. 5 is an enlarged view of the area CH1 of FIG. 4.

FIG. 5 is an enlarged view of the area CH1 of FIG. 4. A level difference may be formed on the sloping surface of the first contact hole CH1 exposing the drain electrode 119. Referring to FIG. 5, at least two steps are formed on the sloping surface of the first contact hole CH1. To reduce the depth of a conventional contact hole, which is relatively large, the first contact hole CH1 is formed to have a level difference while being increased in size, and the organic insulating film 125 is formed to have a gradual slope. For example, the first contact hole CH1 may be formed to have a width greater than the related art contact hole. Additionally or alternatively, one or more level differences may be formed along a sloping surface of the first contact hole CH1 to increase the width of the first contact hole CH1. In FIG. 5, the first contact hole CH1 may include the portions etched and/or patterned from the organic insulating film 125. Accordingly, an alignment film 150 applied at a later stage in the substrate forming process is easily spread into the first contact hole CH1.

Figure 6:
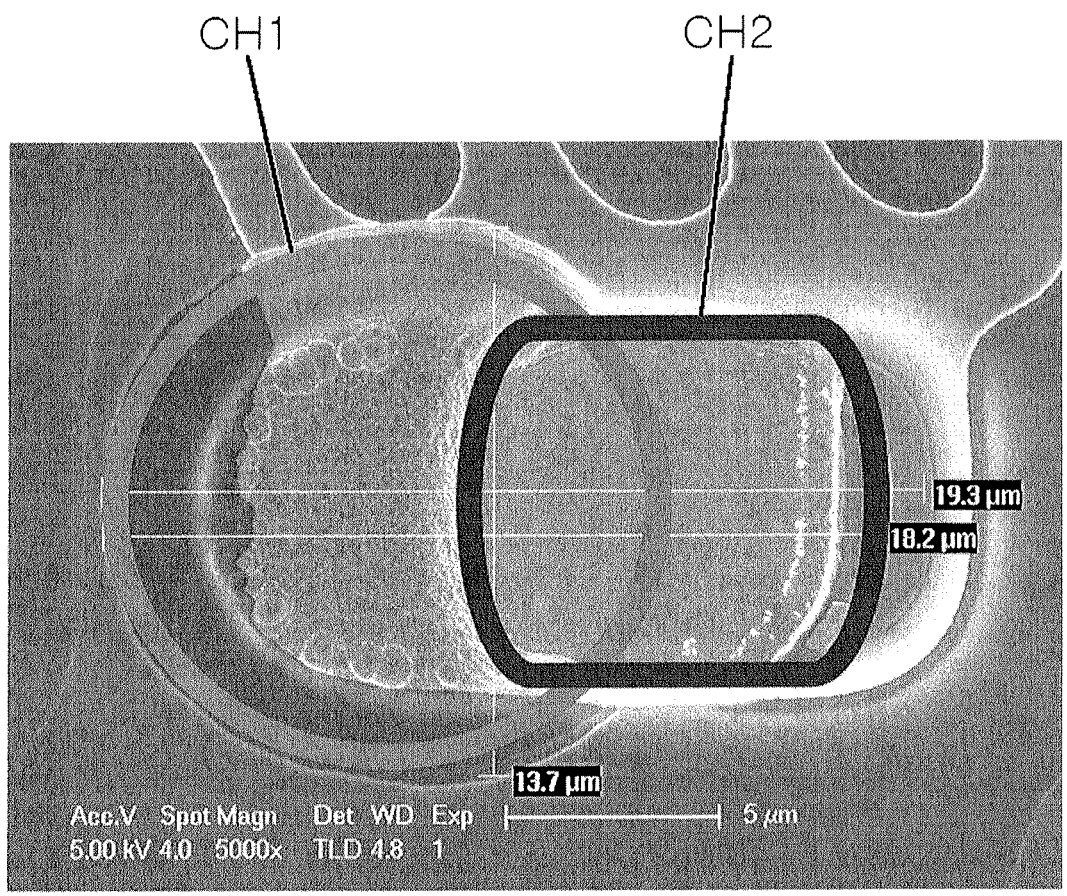
FIG. 6 is a picture showing a top plan view of the area CH1 of FIG. 4.

The second contact hole CH2, which is formed in the passivation film 130 and on the organic insulating film 125 to expose the drain electrode 119, is formed in a different area as the first contact hole CH1 e.g., to partially overlap with the first contact hole CH1. FIG. 6 is a picture showing a top plane view including the area CH1 of FIG. 4. As shown in FIG. 6, when viewing the planar shapes of the first contact hole CH1 and second contact hole CH2, the first contact hole CH1 and the second contact hole CH2 partially overlap each other.

Therefore, when the passivation film 130 comes into contact with part of the drain electrode 119 exposed by the first contact hole CH1, part of the sloping portion of the organic insulating film 125 is exposed. Consequently, as seen from the area CH2 of FIG. 5, another level difference may be formed between the organic insulating film 125 and the passivation film 130, thus easing the subsequent spreading of the alignment film 150.

As shown in FIG. 5, the alignment film 150 is spread over the array substrate for the liquid crystal display having the above-described structure as follows: the alignment film 150 is well-spread in the area ① because the surface of the passivation film 130 is hydrophobic; the alignment film 150 to be spread in the area ② is drawn into the first and second contact holes CH1 and CH2 by gravity; and the alignment film 150 to be spread in the areas ③ and ④ is continuously supplied downward from the surface of the passivation film 130, passes through the hydrophobic surface of the passivation film 130 in a pushing-out manner, and fills the first and second contact holes CH1 and CH2. Particularly, the alignment film 150 can be easily spread and fill the first and second contact holes CH1 and CH2 due to the two level differences (e.g., steps) formed on the organic insulating film 125.

As described above, the array substrate for the liquid crystal display in accordance with the exemplary embodiment of the present invention has the advantage of preventing non-spreading of an alignment film into a contact hole through which a pixel electrode contacts a drain electrode, at the time of application of the alignment film, by forming a plurality of steps on the sloping surface of an organic insulating film.

Now, a method for manufacturing the array substrate for the liquid crystal display of FIG. 4 in accordance with an exemplary embodiment of the present invention will be described. FIGS. 7a to 7e are views showing in steps a method for manufacturing an array substrate for a liquid crystal display in accordance with an exemplary embodiment of the present invention.

Figure 7A:
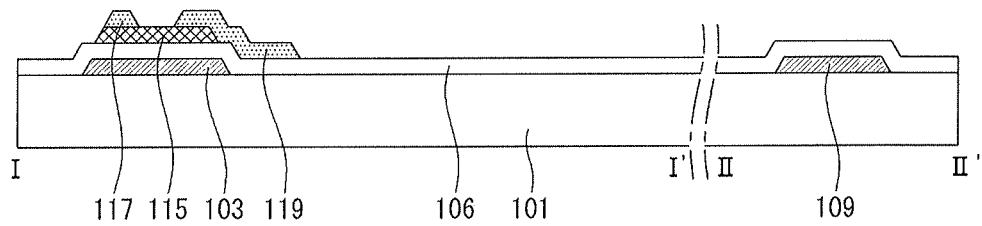
FIGS. 7a to 7e are views showing steps in a method for manufacturing an array substrate for a liquid crystal display in accordance with an exemplary embodiment of the present invention.

Referring to FIG. 7a, in the method for manufacturing an array substrate for a liquid crystal display in accordance with the exemplary embodiment of the present invention, a metal material having low resistance is selected from an exemplary group including aluminum (Al), an aluminum alloy, copper (Cu), a copper alloy, chrome (Cr), molybdenum (Mo), and titanium (Ti) and is deposited on a substrate 101. The metal material is patterned to form a gate electrode 103 and a common line 109.

After that, a gate insulating film 106 is formed by depositing silicon oxide (SiOx) or silicon nitride (SiNx) on the gate electrode 103 and the common line 109. Next, a semiconductor layer 115 is formed, e.g., by depositing and patterning amorphous silicon on the substrate 101. Next, a metal material having low resistance is selected from the exemplary group including aluminum (Al), an aluminum alloy, copper (Cu), a copper alloy, chrome (Cr), molybdenum (Mo), and titanium (Ti) and is deposited on the substrate 101 having the semiconductor layer 115. The metal material is patterned to form a source electrode 117 and a drain electrode 119 respectively connected to opposite ends of the semiconductor layer 115. The gate insulating film 106 is etched to expose the common line 109.

Figure 7B:
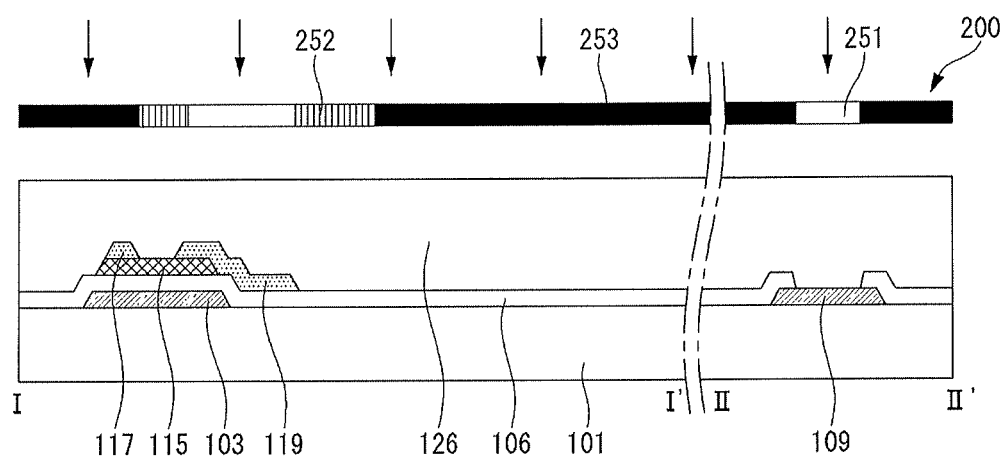

Next, referring to FIG. 7b, a photoresist film 126 may be applied onto the substrate 101 comprising the source electrode 117 and the drain electrode 119, such as through a spin coating method. The photoresist film 126 is a positive photoresist film, and may be decomposed and eliminated later upon light irradiation. Next, a halftone mask 200 that includes a transmission part 251, a semi-transmission part 252, and a light blocking part 253 may be aligned on the substrate 101 having the photoresist film 126. UV rays may then be irradiated to the halftone mask 200.

Figure 7C:
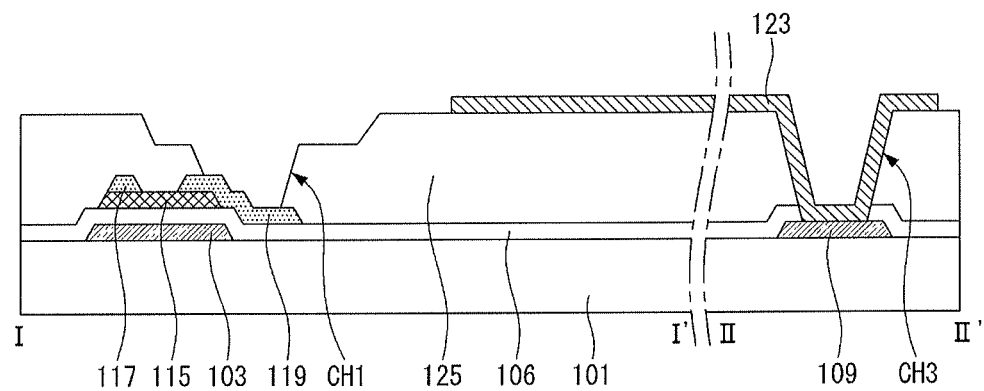

Next, referring to FIG. 7c, the photoresist film 126 is developed by a diffractive exposure technique using the halftone mask 200, thereby forming an organic insulating film 125 having a thickness difference. More specifically, after applying the diffractive exposure technique using the halftone mask 200, the photoresist film 126 facing the light blocking part 253 remains entirely, and the photoresist film 126 facing the semi-transmission part 252 is reduced to a lesser thickness through diffracted and transmitted light, e.g., a lesser thickness of less than half of the entire photoresist film. The lesser thickness may be more than half of the entire photoresist film in some embodiments. As a result, a level difference (e.g., a slope or step) is formed on the organic insulating film 125. The photoresist film 126 facing the transmission part 251 is decomposed during development and entirely eliminated, thereby exposing the surface of the drain electrode 119. In this way, the first contact hole CH1 may be formed to include one or more stepped level differences, and forming the first contact hole CH1 and the stepped level differences may occur at the same time through the above-described decomposition of the photoresist film 126.

Accordingly, the organic insulating film 125 has a first contact hole CH1 exposing the drain electrode 119 and a third contact hole CH3 exposing the common line 109.

Next, a transparent conductive material selected from an exemplary group including ITO, IZO, ITZO, and ZnO is deposited on the substrate 101 having the first and third contact holes CH1 and CH3, and then patterned to form a common electrode 123. The common electrode 123 has a plate shape, and is formed to contact the common line 109 via the third contact hole CH3.

Figure 7D:
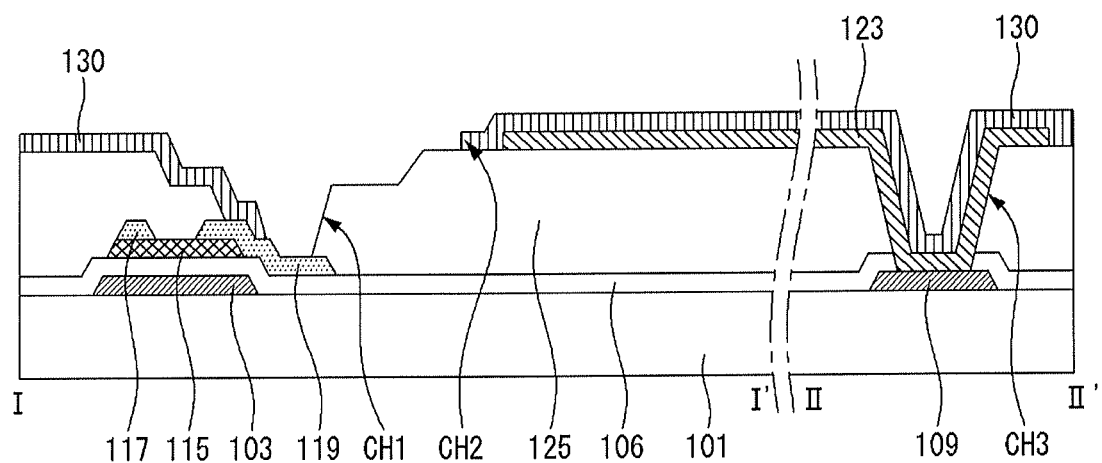

Subsequently, referring to FIG. 7d, silicon oxide (SiOx) or silicon nitride (SiNx) is deposited on the substrate 101 having the common electrode 123 to form a passivation film 130. Then, the passivation film 130 is etched to form a second contact hole CH2 exposing the first contact hole CH1 formed in the organic insulating film 125. As previously explained, the second contact hole CH2 partially overlaps the first contact hole CH1, and hence part of the passivation film 130 is formed to be in direct contact with the drain electrode 119.

Figure 7E:
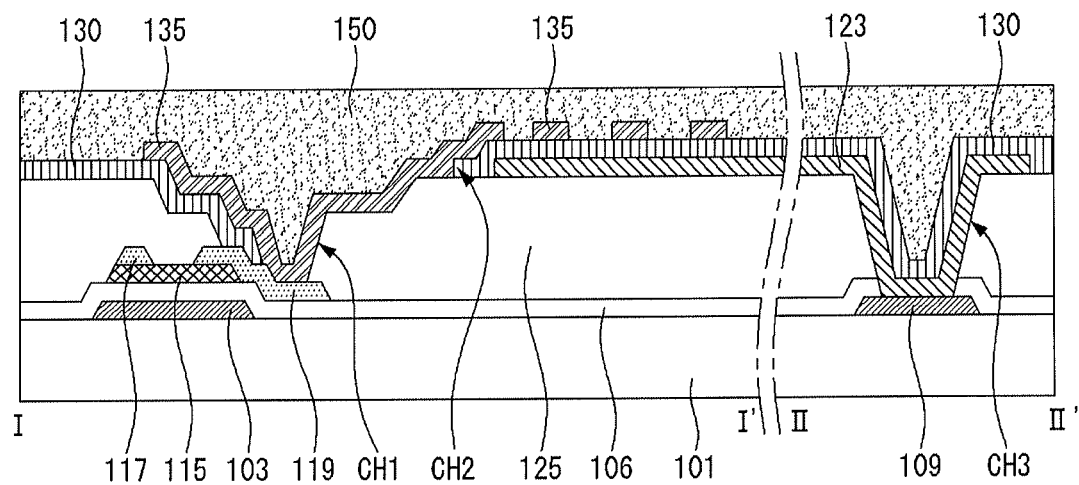

Next, referring to FIG. 7e, a transparent conductive material selected from the exemplary group including Indium Tin Oxide (ITO), Indium Zinc Oxide (IZO), Indium Tin Zinc Oxide (ITZO), and Zinc Oxide (ZnO) is deposited on the substrate 101 having the passivation film 130, and then patterned to form a pixel electrode 135. The pixel electrode 135 comes into direct contact with the drain electrode 119 via the first contact hole CH1 and the second contact hole CH2, and has a finger shape in the region corresponding to the common electrode 123.

Polyimide can be applied onto the substrate 101 having the pixel electrode 135 to form an alignment film 150. As polyimide is applied in a liquid form, the alignment film 150 is applied and widely spread over the substrate 101. As a step-like level difference is formed on the organic insulating film 125, the spreading of the alignment film 150 occurs more completely, and gravity may push the alignment film 150 down the level differences allowing the contact holes CH1 and CH2 to be filled.

As described above, the array substrate for the liquid crystal display and the method for manufacturing the same in accordance with the exemplary embodiment of the present invention have the advantage of preventing defective spreading of an alignment film by forming a level difference in a contact hole through which a pixel electrode contacts a drain electrode. Accordingly, it possible to prevent the generation of smudges and the occurrence of display quality deterioration.

Figure 8A:
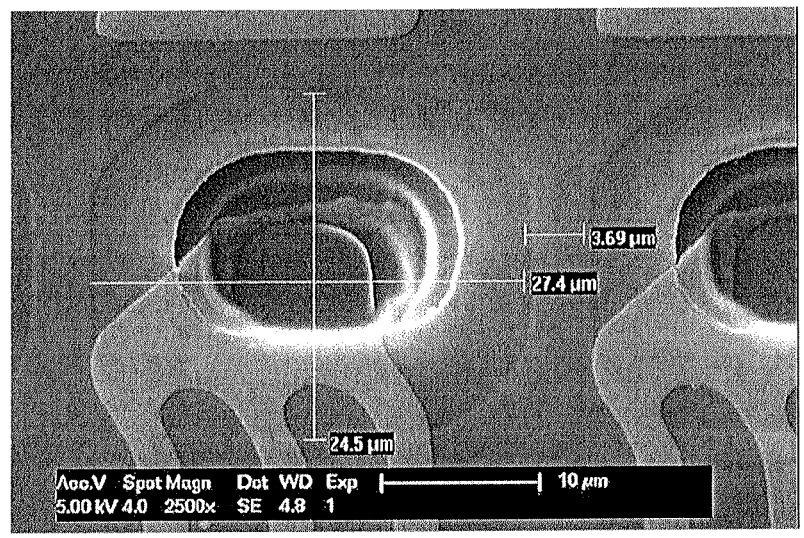
FIG. 8a is a picture showing contact holes of the present invention.
Figure 8B:
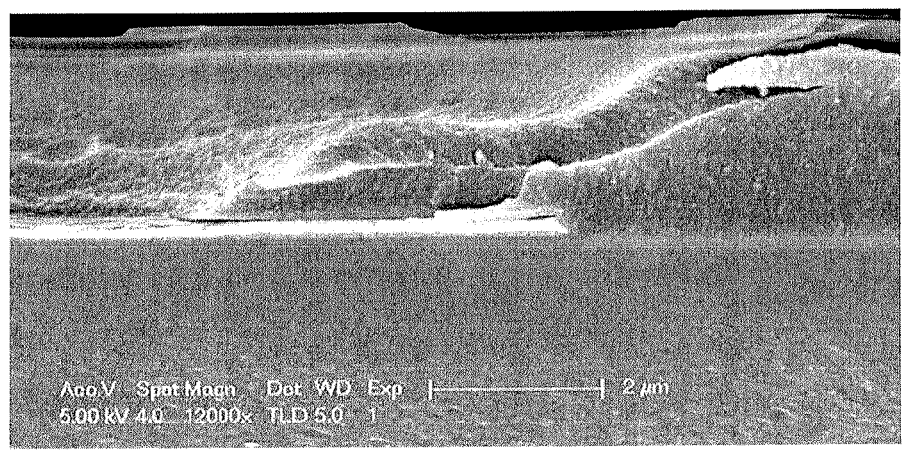

FIG. 8a is a picture showing contact holes of the one or more embodiments of the present invention. FIG. 8b is a picture showing the contact holes of FIG. 8a. Referring to FIGS. 8a and 8b, a finger-shaped pixel electrode and first and second contact holes each having a level difference can be observed, especially, an organic insulating film having two steps can be observed.

The present disclosure may relate to high-definition vertical/horizontal electric field type liquid crystal displays, and can be applied to produce a display device which offers very high resolution. A high-resolution model has more pixels than non high-resolution models. Thus, this model has an increased number of contact holes through which a pixel electrode and a drain electrode come into contact with each other, and the percentage of area occupied by the contact holes is increased. Thus, the present disclosure may be applied to high-resolution display devices to increase the effectiveness of the spreading of the alignment film.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An array substrate for a liquid crystal display, comprising:
   a substrate;
   a gate line and a common line positioned on the substrate;
   a gate insulating film positioned on the gate line and the common line;
   a semiconductor layer positioned on the gate insulating film, and facing the gate line;
   a source electrode and a drain electrode positioned on the semiconductor layer;
   an organic insulating film positioned on the source electrode and the drain electrode, comprising a first contact hole exposing the drain electrode, and having a stepped level difference formed on a sloping surface of the first contact hole;
   a common electrode positioned on the organic insulating film, and connected to the common line;
   a passivation film positioned on the substrate having the common electrode, and contacting the drain electrode via the first contact hole; and
   a pixel electrode positioned on the passivation film to correspond to the common electrode, and contacting the drain electrode, wherein the pixel electrode contacts the organic insulating film in the first contact hole and includes a stepped portion corresponding to and adjacent to the stepped level difference on the sloping surface of the first contact hole.

2. The array substrate of claim 1, wherein the passivation film comprises a second contact hole exposing the drain electrode exposed by the first contact hole.

3. The array substrate of claim 2, wherein the first contact hole and the second contact hole partially overlap.

4. The array substrate of claim 2, further comprising an alignment film formed on the surface of the substrate comprising the pixel electrode and where the alignment film is formed over the first contact hole and the second contact hole.

5. The array substrate of claim 1, wherein the stepped level difference formed on the organic insulating film comprises multiple steps.

6. The array substrate of claim 1, wherein the common electrode contacts the common line via a third contact hole penetrating the organic insulating film and the gate insulating film.

7. The array substrate of claim 1, further comprising an alignment film formed on the surface of the substrate comprising the pixel electrode and where the alignment film covers at least the first contact hole.

8. The method of claim 1, wherein the passivation film covers only a portion of the sloping surface of the first contact hole, and the pixel electrode is in contact with both the passivation film and the organic insulating film in the first contact hole.

* * * * *